(12) United States Patent
Nakajima et al.

(10) Patent No.: US 6,456,499 B1
(45) Date of Patent: Sep. 24, 2002

(54) ELECTRONIC APPARATUS HAVING INSULATOR FOR FIXING WIRING SUBSTRATE

(75) Inventors: Yuji Nakajima, Nishitama-gun; Jyoji Kusamoto; Yosuke Miura, both of Ome, all of (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 09/955,067

(22) Filed: Sep. 19, 2001

(30) Foreign Application Priority Data

Sep. 25, 2000 (JP) ......................................... 2000-291298

(51) Int. Cl.⁷ ............................ H05K 5/00; H05K 7/14; H04B 1/38

(52) U.S. Cl. ..................... 361/752; 174/255; 361/756; 361/800; 455/90; 455/129

(58) Field of Search ................. 257/684; 361/680–683, 361/748–749, 752, 800–803, 816; 343/700–702; 455/90, 128–129; 174/250–268

(56) References Cited

U.S. PATENT DOCUMENTS

| 5,828,341 A | * | 10/1998 | Delamater | 343/702 |
| 5,966,098 A | * | 10/1999 | Qi | 343/702 |
| 6,054,956 A | * | 4/2000 | Mandai | 343/702 |
| 6,094,785 A | * | 8/2000 | Montgomery | 24/324 |
| 6,249,254 B1 | * | 6/2001 | Bateman | 343/700 MS |
| 6,285,328 B1 | * | 9/2001 | Masaki | 343/702 |

* cited by examiner

*Primary Examiner*—Jayprakash N. Gandhi
*Assistant Examiner*—Michael L. Lindinger
(74) *Attorney, Agent, or Firm*—Finnegan, Henderson, Farabow, Garrett & Dunner, L.L.P.

(57) ABSTRACT

An electronic apparatus comprises a box-like casing. A substrate mounting section to which a wiring substrate is mounted is arranged within the casing. The substrate mounting section includes a guide section for determining the installing position of the wiring substrate. The wiring substrate is covered with a flexible insulator. Further, the insulator includes a fixed end fixed to the casing and a free end that is caught in the casing. The free end of the insulator is caught on the casing so as to have the wiring substrate held between the insulator and the substrate mounting section.

21 Claims, 6 Drawing Sheets

ELECTRONIC APPARATUS HAVING INSULATOR FOR FIXING WIRING SUBSTRATE

CROSS-REFERENCE TO RELATED APPLICATIONS

This application is based upon and claims the benefit of priority from the prior Japanese Patent Application No. 2000-291298, filed Sep. 25, 2000, the entire contents of which are incorporated herein by reference.

BACKGROUND OF THE INVENTION

1. Field of the Invention

The present invention relates to an electronic apparatus such as a portable computer having, for example, an antenna substrate for wireless communication mounted thereto, particularly, to the structure for fixing the antenna substrate to the casing of an electronic apparatus.

2. Description of the Related Art

Known is a portable electronic apparatus such as a portable computer equipped with a wireless communication function such as a wireless LAN. The electronic apparatus of this type is equipped with an antenna substrate having an antenna element mounted thereto. It is necessary to mount the antenna substrate in a position at which a good transmitting-receiving performance of data can be maintained. Therefore, in the conventional general portable computer equipped with an openable display unit, the antenna substrate is incorporated inside the display unit.

The display unit includes a flat box-like display housing and a liquid crystal display module housed in the display housing. The display housing includes a display cover for supporting the liquid crystal display module. A substrate mounting section for holding the antenna substrate is formed in a part of the inner surface of the display cover. The substrate mounting section includes at least one boss portion. The boss portion projects from the inner surface of the display cover in the thickness direction of the display housing. The antenna substrate is fixed to the tip of the boss portion with a screw and is held by the substrate mounting section in a posture to face the inner surface of the display cover.

That surface of the antenna substrate held by the substrate mounting section which is opposite to the inner surface of the display cover is covered with an insulator. The insulator, which is formed of a synthetic resin film, is interposed between the antenna substrate and the liquid crystal display module so as to electrically insulate the antenna substrate from the liquid crystal display module.

According to the conventional portable computer, the substrate mounting section is provided with a boss portion receiving a screw for fixing the antenna substrate. It is necessary for the boss portion to project at least about 5 mm from the inner surface of the display cover in order to ensure a sufficient screw-in amount of the screw. As a result, a useless space is generated between the antenna substrate and the inner surface of the display cover so as to obstruct the reduction in the thickness of the display housing.

Further, screws used exclusively for fixing the antenna substrate are required, leading to an increase in the number of parts of the portable computer. In addition, it is unavoidable to manually fasten the screw in fixing the antenna substrate to the substrate mounting section. It follows that the number of working steps is increased in assembling a portable computer, which increases the manufacturing cost of the portable computer.

BRIEF SUMMARY OF THE INVENTION

An object of the present invention, which has been achieved in view of the situation described above, is to provide an electronic apparatus, which permits making the casing housing the wiring substrate as thin as possible and also permits suppressing the number of parts used and the number of assembling steps so as to lower the manufacturing cost.

According to a first aspect of the present invention, which is intended to achieve the above-noted object, there is provided an electronic apparatus, comprising a box-like casing having a substrate mounting section arranged therein; a wiring substrate mounted to the substrate mounting section of the casing; a guide section formed in the substrate mounting section for determining the installing position of the wiring substrate relative to the substrate mounting section; and a flexible insulator covering the wiring substrate.

The insulator has a fixed end fixed to the casing and a free end detachably caught by the casing. The free end of the insulator is caught by the casing so as to allow the wiring substrate to be held between the insulator and the substrate mounting section.

According to a second aspect of the present invention, which is intended to achieve the above-noted object, there is provided an electronic apparatus, comprising a box-like first casing; a box-like second casing supported by the first casing, swingable between a closing position to which the second casing falls down to cover the first casing from above and an opening position to which the second casing rises to expose the first casing to the outside, and having a substrate mounting section arranged therein; a wiring substrate mounted to the substrate mounting section of the second casing; a guide section formed on the substrate mounting section and serving to determine the installing position of the wiring substrate relative to the substrate mounting section; and a flexible insulator covering the wiring substrate. The insulator includes a fixed end fixed to the second casing, and a free end that is detachably caught on the second casing. The free end of the insulator is caught on the second casing so as to have the wiring substrate held between the insulator and the substrate mounting section.

In order to have the wiring substrate held by the substrate mounting section in the construction described above, the wiring substrate is set on the substrate mounting section in conformity with the guide section, followed by allowing the insulator to cover the wiring substrate and allowing the free end of the insulator to be caught on the casing. As a result, the wiring substrate is covered with the insulator and is held between the insulator and the substrate mounting section.

According to the construction described above, it is unnecessary to use a screw used exclusively for fixing the wiring substrate and a boss portion receiving the screw, and the wiring substrate can be held in a position to extend along the substrate mounting section. As a result, a useless space corresponding to the height of the boss portion is not generated between the wiring substrate and the substrate mounting section so as to decrease the thickness of the casing.

Further, since the screw is not required, it is possible to decrease the number of parts of the electronic apparatus. In addition, since the troublesome operation to fasten or loosen the screw is not required, it is possible to decrease the number of working steps in assembling the electronic apparatus so as to lower the manufacturing cost of the electronic apparatus.

According to a third aspect of the present invention, which is intended to achieve the above-noted object, there is provided an electronic apparatus, comprising a box-like casing having a substrate mounting section arranged therein; an antenna substrate for a wireless communication that is mounted to the substrate mounting section of the casing; a cable connected to the antenna substrate and arranged within the casing; a guide section formed in the substrate mounting section for determining the installing position of the antenna substrate relative to the substrate mounting section; and a flexible insulator covering the antenna substrate. The insulator includes a fixed end connected to the casing, a free end detachably caught on the casing, and a holding section for detachably holding the cable. The free end of the insulator is caught on the casing so as to have the antenna substrate held between the insulator and the substrate mounting section.

In order to have the antenna substrate held by the substrate mounting section in the construction described above, the antenna substrate is set on the substrate mounting section in conformity with the guide section. Then, the insulator is disposed to cover the antenna substrate, and the free end of the insulator is caught on the casing. As a result, the antenna substrate is covered with the insulator and is held between the insulator and the substrate mounting section.

According to the construction described above, it is unnecessary to use a screw used exclusively for fixing the wiring substrate and a boss portion receiving the screw, and the wiring substrate can be held in a position to extend along the substrate mounting section. As a result, a useless space corresponding to the height of the boss portion is not generated between the wiring substrate and the substrate mounting section so as to decrease the thickness of the casing.

Further, since the screw is not required, it is possible to decrease the number of parts of the electronic apparatus. In addition, since the troublesome operation to fasten or loosen the screw is not required, it is possible to decrease the number of working steps in assembling the electronic apparatus so as to lower the manufacturing cost of the electronic apparatus.

What should also be noted is that the cable connected to the antenna substrate can be held by utilizing the insulator. It follows that the position of the cable relative to the antenna substrate is determined, with the result that the cable can be set smoothly.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A portable computer as an electronic apparatus according to a first embodiment of the present invention will now be described with reference to FIGS. 1 to 7.

Figure 1:
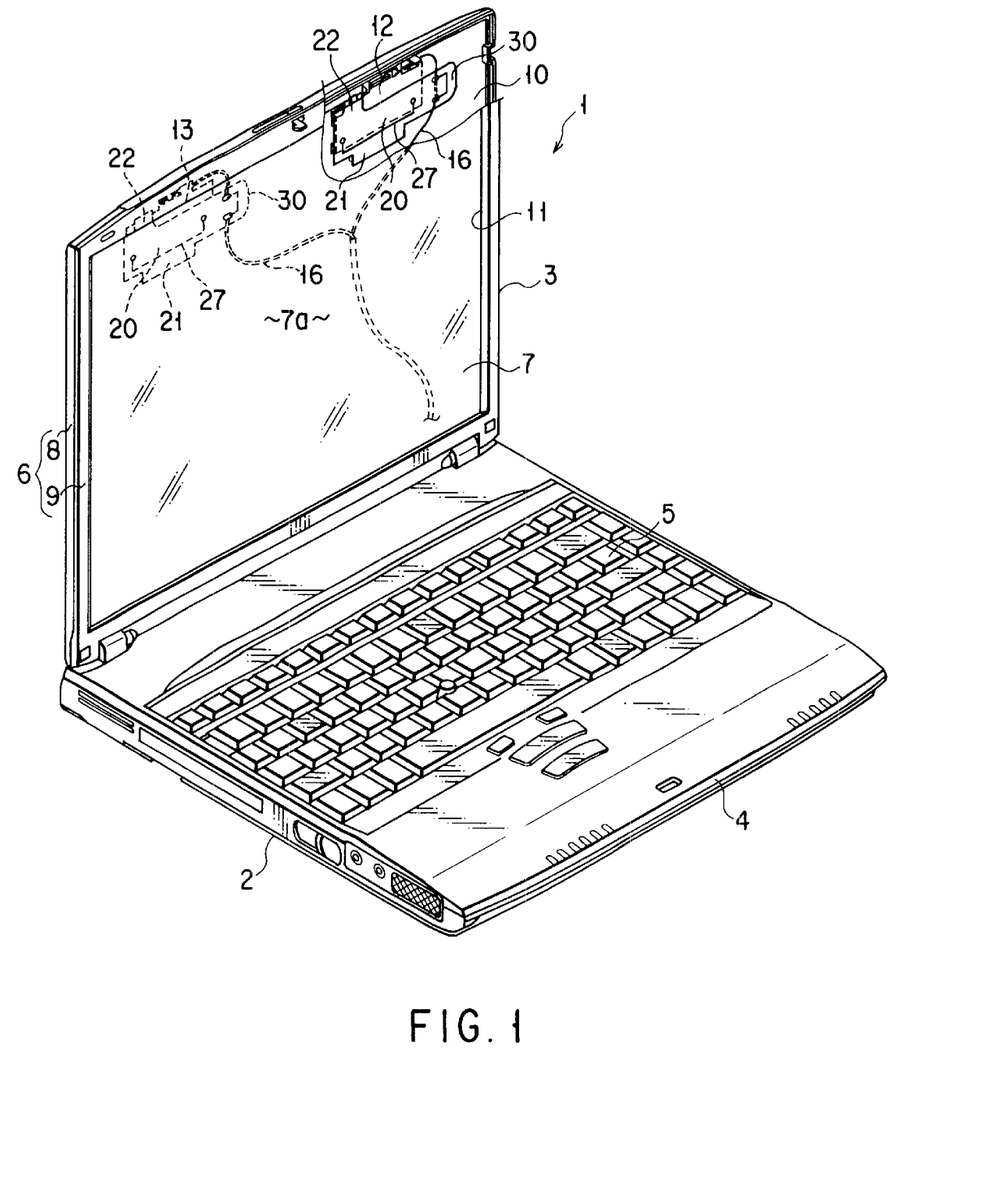
FIG. 1 is a perspective view showing a portable computer according to a first embodiment of the present invention.

FIG. 1 is a perspective view showing a portable computer 1 as an electronic apparatus according to the first embodiment of the present invention. As shown in the drawing, the portable computer 1 comprises a computer body 2 and a display unit 3 supported by the computer body 2.

The computer body 2 includes a box-like first casing 4 housing a system substrate (not shown) having a CPU mounted thereon and a memory device such as a hard disk driving device. A key board 5 is arranged on the upper surface of the first casing 4.

The display unit 3 includes a display housing 6 as a second casing and liquid crystal display module 7 housed inside the display housing 6. The display housing 6 is formed of a display cover 8 and a display mask 9 joined to the display cover 8. The display cover 8 includes a supporting wall 10 for supporting the liquid crystal display module 7. Further, the display mask 9 includes an open portion 11 exposing a display screen 7a of the liquid crystal display module 7.

The display unit 3 is supported by the rear end portion of the first casing 4 via a hinge device (not shown). Therefore, the display unit 3 is swingable between a first position to which the display unit 3 falls down in a manner to cover the first casing 4 from above and a second position to which the display unit 3 rises in a manner to expose the key board 5 and the display screen 7a to the outside.

The display housing 6 houses a pair of antenna substrates 12, 13 for a wireless communication such as a wireless LAN. The antenna substrates 12, 13 are arranged such that, when the display unit 3 is swung to the second position, the antenna substrates 12, 13 are positioned in the upper end portion of the display housing 6, which is remotest from the computer body 2. Also, the antenna substrates 12 and 13 are apart from each other in the width direction of the display unit 3.

The antenna substrates 12, 13 are supported by the supporting wall 10 of the display cover 8. These antenna substrates 12 and 13 are equal to each other in the construction and the supporting structure and, thus, the antenna substrate 12 is described as a representative.

Figure 2:
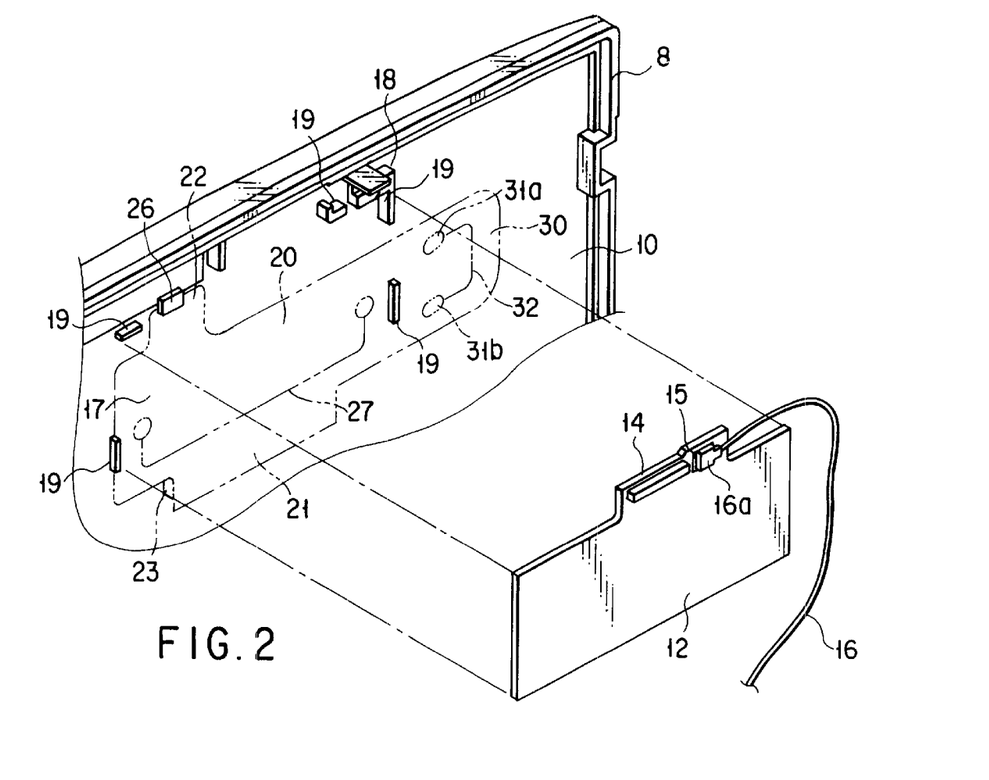
FIG. 2 is a perspective view showing the positional relationship between the substrate mounting section of a display cover and the antenna substrate according to the first embodiment of the present invention.

As shown in FIG. 2, the antenna substrate 12 is in the form of an oblong plate having four outer peripheral edge portions and has a thickness of, for example, about 0.5 mm. A convex portion 14 is formed in one of the outer peripheral edge portions of the antenna substrate 12, and a connector 15 is mounted to the convex portion 14.

Figure 3:
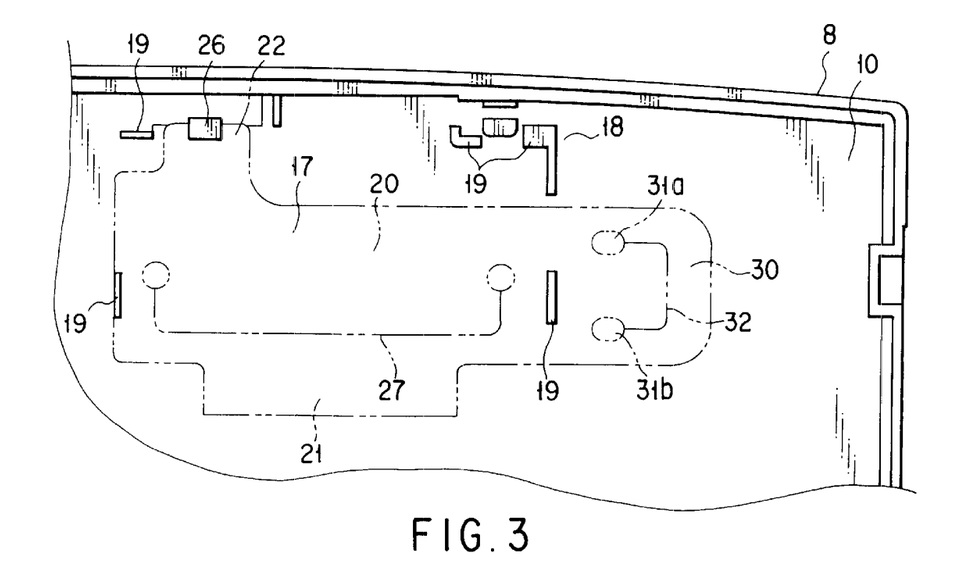
FIG. 3 is a plan view showing the substrate mounting section of the display cover according to the first embodiment of the present invention.

The supporting wall 10 of the display cover 8 includes a substrate mounting section 17 for holding the antenna substrate 12. The substrate mounting section 17 is positioned on the inner surface of the supporting wall 10 and includes a guide portion 18 for determining the installing position of the antenna substrate 12. The guide portion 18 is formed of a plurality of convex portions 19 in contact with the outer peripheral edge portions of the antenna substrate 12. The convex portions 19 protrude from the inner surface of the supporting wall 10, and the protruding height is determined to permit at least the outer peripheral edge portion of the antenna substrate 12 to be caught by the convex portions 19.

Figure 6:
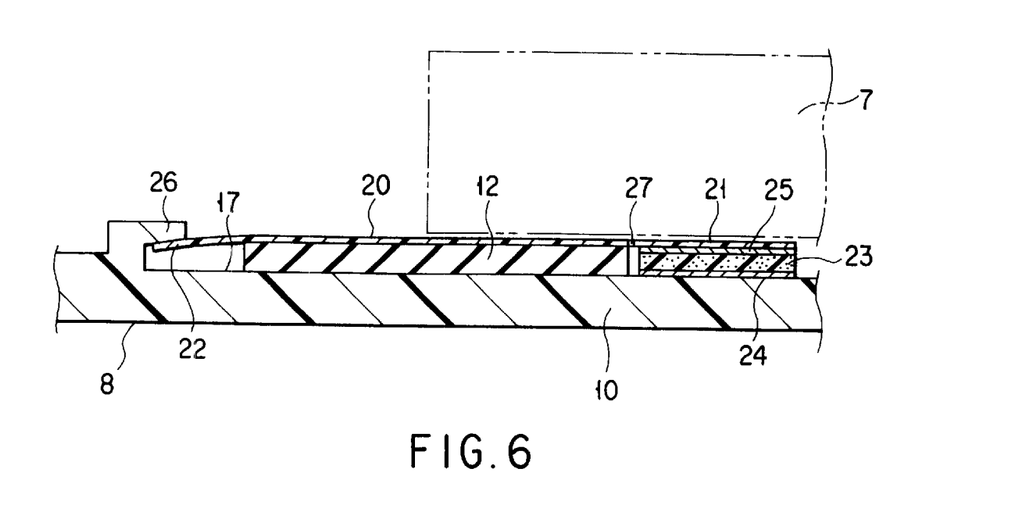
FIG. 6 is a cross sectional view showing the state that the antenna substrate is held by the substrate mounting section of a display cover in the first embodiment of the present invention.

If the antenna substrate 12 is disposed in the region surrounded by the convex portions 19, these convex portions 19 are caught on the four outer peripheral edge portions of the antenna substrate 12, with the result that the free movement of the antenna substrate 12 is limited. It follows that the antenna substrate 12 is positioned accurately on the substrate supporting section 17 in a posture to extend along the inner surface of the supporting wall 10. As shown in FIG. 6, under the state that the antenna substrate 12 it is positioned in the substrate supporting section 17, the antenna substrate 12 is partly positioned between the liquid crystal display module 7 and the supporting wall 10. As a result, the antenna substrate 12 and the liquid crystal display module 7 overlap with each other in the thickness direction of the display housing 6.

As shown in FIG. 2, a terminal 16a mounted to one end of a cable 16 is connected to the connector 15 of the antenna substrate 12. The cable 16 is arranged to extend through the clearance between the supporting wall 10 of the display cover 8 and the liquid crystal display module 7. The tip of the cable 16 is guided into the inner space of the first casing 4 so as to be electrically connected to the system substrate.

Figure 4:
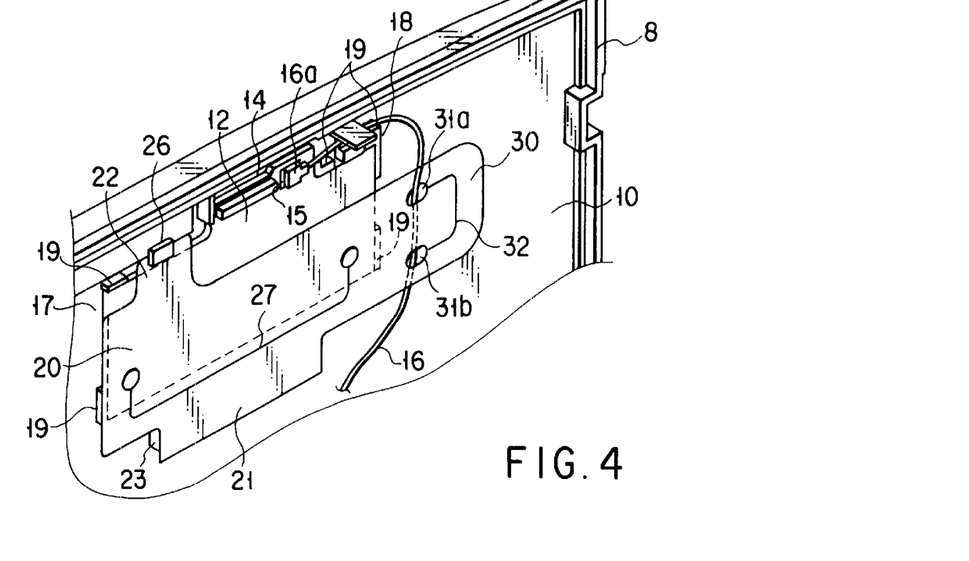
FIG. 4 is a perspective view showing the state that the antenna substrate is held by the substrate mounting section of a display cover by using an insulator in the first embodiment of the present invention.
Figure 5:
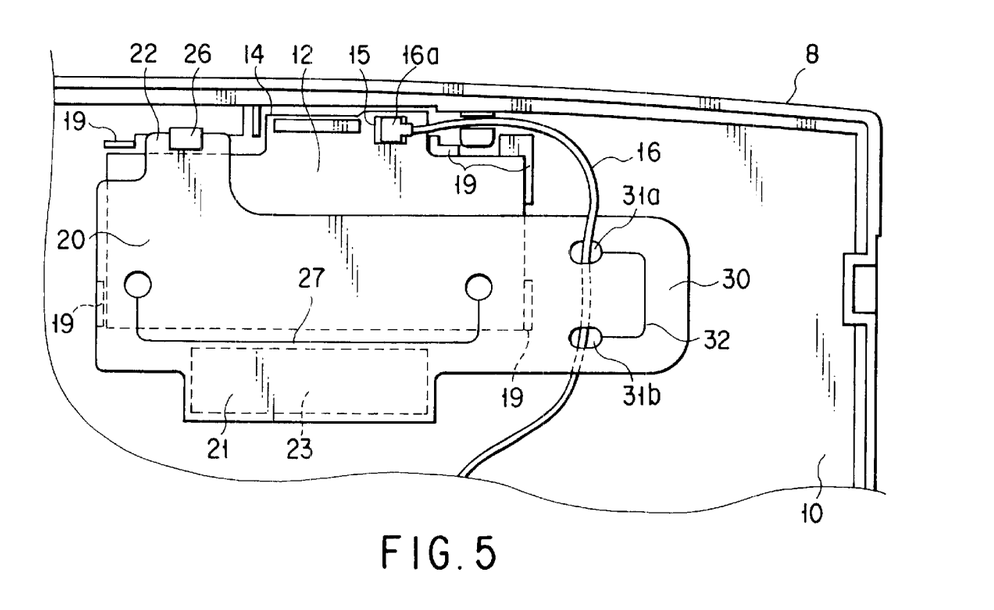
FIG. 5 is a plan view showing the state that the antenna substrate is held by the substrate mounting section of a display cover in the first embodiment of the present invention.

As shown in FIGS. 4 and 5, the antenna substrate 12 is covered with an insulator 20, which is formed of a synthetic resin film and shaped oblong to conform with the antenna substrate 12. The insulator 20 is flexible and has a mechanical strength high enough to maintain a flat shape.

The insulator 20 has a fixed end 21 and a free end 22, which are separated from each other with the antenna substrate 12 interposed therebetween. The fixed end 21 is positioned below the antenna substrate 12 when the display unit 3 is swung to the second position. As shown most clearly in FIGS. 6 and 7, the fixed end 21 is bonded to the inner surface of the supporting wall 10 with a spacer 23 interposed therebetween. The spacer 23, which is intended to permit the insulator 20 to be positioned flush with the antenna substrate 12, is formed of an elastically deformable sponge. One surface of the spacer 23 is bonded to the supporting wall 10 with a first adhesive tape 24 interposed therebetween, with the opposite surface being bonded to the fixed end 21 of the insulator 20 with a second adhesive tape 25 interposed therebetween. It follows that the insulator 20 is capable of an elastic deformation toward and away from the substrate mounting section 17 in a manner to be swung about the fixed end 21.

Figure 7:
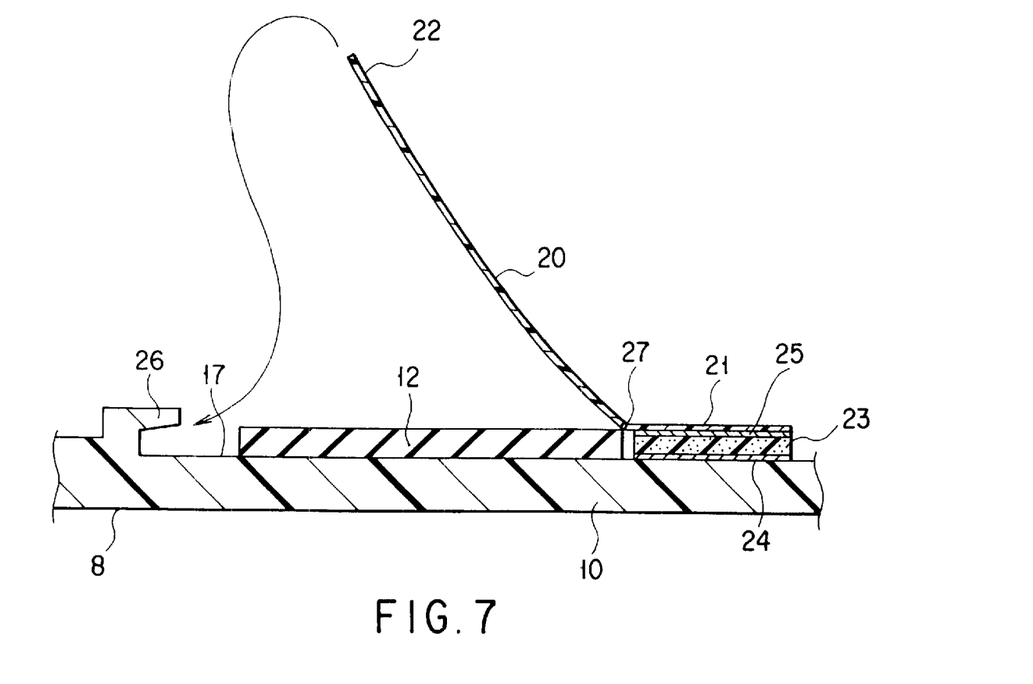
FIG. 7 is a cross sectional view showing a deformed state of the insulator in the first embodiment of the present invention.

The free end 22 of the insulator 20 extends away from the fixed end 21 and protrudes around the antenna substrate 12. The tip of the free end 22 is detachably caught by an engaging section 26 protruding from the inner surface of the supporting wall 10. If the free end 22 is caught by the engaging section 26, the insulator 20 is allowed to cover the antenna substrate 12 so as to electrically insulate the antenna substrate 12 from the liquid crystal display module 7. At the same time, the insulator 20 pushes the antenna substrate 12 toward the substrate mounting section 17, with the result that the antenna substrate 12 is held between the insulator 20 and the substrate mounting section 17.

As shown in FIGS. 4 and 5, the insulator 20 has a slit 27, which is formed in a position adjacent to the fixed end 21 in a manner extending in the longitudinal direction of the insulator 20. The slit 27 facilitates the folding of the insulator 20 so as to facilitate the operation to cause the tip of the free end 22 to be caught by the engaging section 26 or to be detached from the engaging portion 26.

The insulator 20 includes a holding section 30 protruding to the side of the antenna substrate 12. The holding section 30 serves to detachably hold the cable 16 connected to the antenna substrate 12 and includes a pair of through holes 31a, 31b through which the cable 16 can extend and a slit 32 bridging these through holes 31a, 31b. The cable 16 is guided into the through hole 31a or 31b through the slit 32 so as to be held by the holding section 30. As a result, the positional relationship between the antenna substrate 12 and the cable 16 is maintained constant and the drawing direction of the cable 16 from the antenna substrate 12 is defined.

In the construction described above, the procedure to allow the antenna substrate 12 to be held by the substrate mounting section 17 of the display cover 8 will now be described.

Before the liquid crystal display module 7 is mounted to the display cover 8, the fixed end 21 of the insulator 20 is bonded to the supporting wall 10 of the display cover 8. Then, the cable 16 is caught on the holding section 30 of the insulator 20 so as to allow the terminal 16a of the cable 16 to be positioned in the vicinity of the substrate mounting section 17.

Then, the insulator 20 is deformed away from the substrate mounting section 17 so as to open the substrate mounting section 17, as shown in FIG. 7. In the next step, the antenna substrate 12 is guided onto the substrate mounting section 17 so as to allow a plurality of outer peripheral edge portions of the antenna substrate 12 to be caught on the convex portions 19. As a result, the antenna substrate 12 is positioned accurately on the substrate supporting section 17 in a posture to extend along the supporting wall 10.

Finally, the free end 22 of the insulator 20 is caught on the engaging section 26 of the display cover 8. As a result, the insulator 20 is brought into a tight contact with the antenna substrate 12 so as to cover the antenna substrate 12 and to have the antenna substrate 12 held between the insulator 20 and the supporting wall 10 in cooperation with the substrate mounting section 17. As a result, the antenna substrate 12 is positioned accurately on the substrate mounting section 17 and retained under this condition.

According to the construction described above, it is possible to have the antenna substrate 12 supported by the substrate mounting section 17 by utilizing the insulator 20. Therefore, it is possible to omit the screw and the boss portion receiving the screw, which were used in the prior art for fixing the antenna substrate 12. It follows that a useless space corresponding to the height of the boss portion is not generated between the antenna substrate 12 and the substrate mounting section 17 so as to make it possible to decrease the thickness of the display housing 6.

Further, since a screw is not required, it is possible to decrease the number of parts of the portable computer 1. Also, since the mounting of the antenna substrate 12 is finished when the antenna substrate 12 is covered with the insulator 20, it is possible to omit the troublesome operation to fasten or loosen the screw. It follows that it is possible to decrease the number of working steps in assembling the portable computer 1 so as to lower the manufacturing cost of the portable computer 1.

What should also be noted is that, since the fixed end 21 of the insulator 20 is bonded to the supporting wall 10 with the spacer 23 interposed therebetween, the insulator 20 is positioned flush with the antenna substrate 12. As a result, when the free end 22 of the insulator 20 is caught on the engaging section 26, the insulator 20 is brought into contact uniformly with substantially the entire surface of the antenna substrate 12. It follows that the antenna substrate 12 is pushed against the substrate mounting section 17 over a wide range and, thus, the antenna substrate 12 is not shook and can be held stably without fail.

Figure 8:
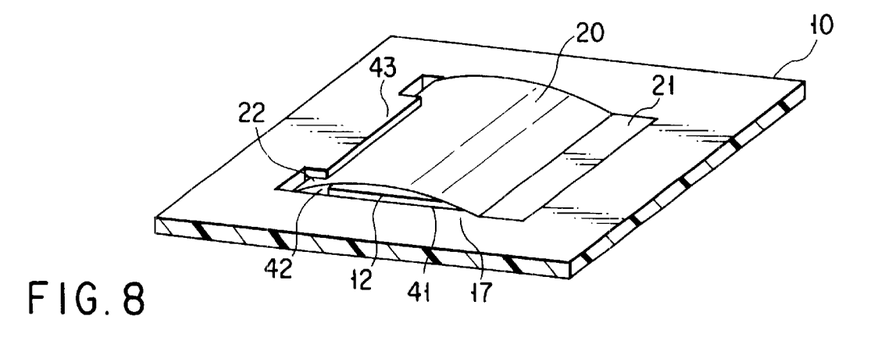
FIG. 8 is a perspective view showing the state that the antenna substrate is held by the substrate mounting section of a display cover in a second embodiment of the present invention.
Figure 9:
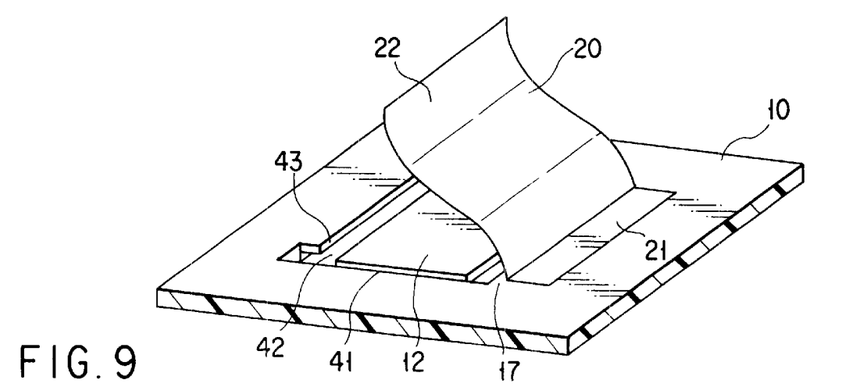
FIG. 9 is a perspective view showing a deformed state of the insulator in the second embodiment of the present invention.
Figure 10:
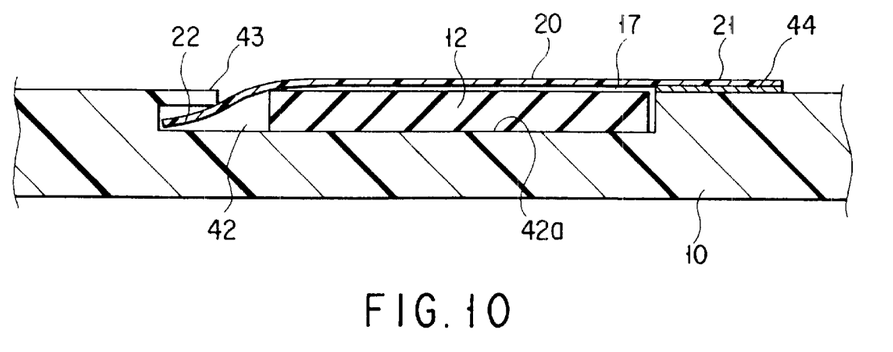
FIG. 10 is a cross sectional view showing the state that the antenna substrate is held by the substrate mounting section of a display cover in the second embodiment of the present invention.

The present invention is not limited to the first embodiment described above, and a second embodiment of the present invention is shown in FIGS. 8 to 10.

The second embodiment differs from the first embodiment mainly in the construction of the guide portion 41 for determining the position of the antenna substrate 12. As shown in FIG. 9, the guide portion 41 includes a concave portion 42. The concave portion 42 is shaped to permit the antenna substrate 12 to be detachably received therein, and the antenna substrate 12 is received by a bottom surface 42a of the concave portion 42. A flange-like engaging section 43 is formed in the open edge portion of the concave portion 42 in a manner to protrude inward from the open edge portion of the concave portion 42.

The fixed end 21 of the insulator 20 is bonded to the inner surface of the supporting wall 10 facing the concave portion 42 with an adhesive tape 44 interposed therebetween. The fixed end 21 is positioned on the side opposite to the engaging section 43 with the concave portion 42 interposed between the fixed end 21 and the engaging section 43, and the free end 22 of the insulator 20 extends toward the engaging section 43. As a result, the concave portion 42 is covered with the insulator 20.

If the antenna substrate 12 is fitted into the concave portion 42 in the construction described above, the free movement of the antenna substrate 12 is limited and, thus, the antenna substrate 12 is positioned with a high accuracy in the substrate mounting section 17.

Under the state that the free end 22 of the insulator 20 is caught on the engaging section 43, the insulator 20 covers the concave portion 42 and is brought into contact with the antenna substrate 12. By this contact, the antenna substrate 12 is pushed against the bottom surface 42a of the concave portion 42, with the result that the antenna substrate 12 is prevented from being released from the concave portion 42. It follows that the insulator 20 cooperates with the bottom surface 42a of the concave portion 42 to have the antenna substrate 12 held therebetween.

Figure 11:
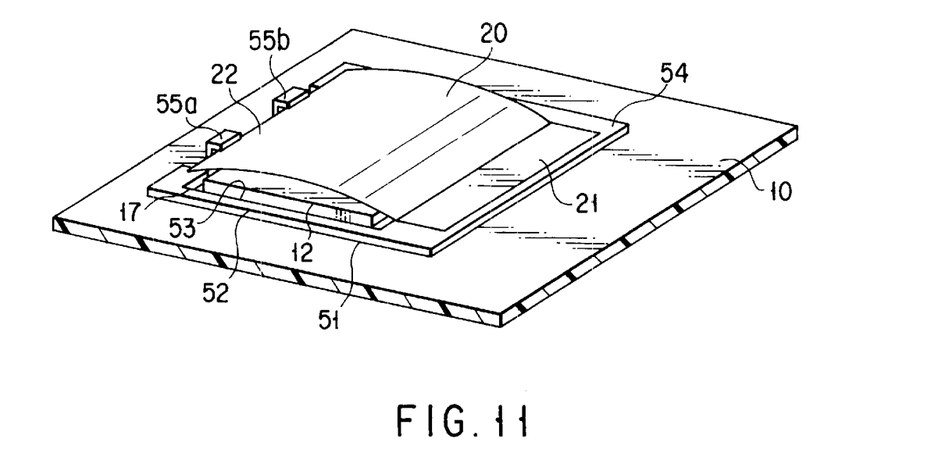
FIG. 11 is a perspective view showing the state that the antenna substrate is held by the substrate mounting section of a display cover in a third embodiment of the present invention.
Figure 12:
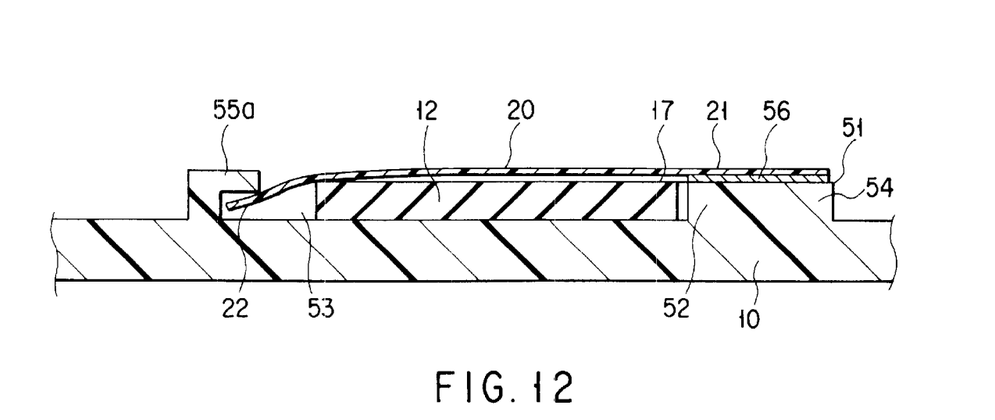
FIG. 12 is a cross sectional view showing the state that the antenna substrate is held by the substrate mounting section of a display cover in the third embodiment of the present invention.

FIGS. 11 and 12 collectively show a third embodiment of the present invention.

The third embodiment differs from the first embodiment mainly in the construction of the guide portion 51 for determining the position of the antenna substrate 12. As shown in FIG. 11, the guide portion 51 includes a wall 52 surrounding the antenna substrate 12. The wall 52 is formed integral with the supporting wall 10 and protrudes inward from the supporting wall 10. Therefore, the wall 52 forms a housing section 53 housing the antenna substrate 12 on the inner surface of the supporting wall 10.

The wall 52 includes a pedestal portion 54 having a large width in a portion corresponding to one side of the antenna substrate 12. Also, the wall 52 includes a pair of engaging sections 55a, 55b positioned on the side opposite to the pedestal portion 54 with the housing section 53 interposed between the pedestal portion 54 and the engaging sections 55a, 55b.

The fixed end 21 of the insulator 20 is bonded to the upper surface of the pedestal portion 54 with an adhesive tape 56 interposed therebetween. The free end 22 of the insulator 20 extends toward the engaging sections 55a, 55b. As a result, the insulator 20 covers the housing section 53 positioned inside the wall 52.

If the antenna substrate 12 is housed in the housing section 53 in the construction described above, the antenna substrate 12 is surrounded by the wall 52, with the result that the free movement of the antenna substrate 12 is limited so as to position accurately the antenna substrate 12 in the substrate mounting section 17.

Under the state that the free end 22 of the insulator 20 is caught on the engaging sections 55a, 55b, the insulator 20 covering the housing section 53 is brought into contact with the antenna substrate 12. By this contact, the antenna substrate 12 is pushed against the inner surface of the supporting wall 10, with the result that the antenna substrate 12 is prevented from being released from the housing section 53. It follows that the insulator 20 cooperates with the inner surface of the supporting wall 10 so as to have the antenna substrate 12 held between the insulator 20 and the inner surface of the supporting wall 10.

In each of the embodiments described above, the insulator 20 is fixed to the display cover with an adhesive tape interposed therebetween. Alternatively, it is possible to use an adhesive in place of the adhesive tape.

Also, in each of the embodiments described above, the technical idea of the present invention is applied to the fixation of an antenna substrate. However, it is also possible to apply the technical idea of the present invention to the fixation of another wiring substrate such as a power source substrate of, for example, a liquid crystal display module.

Further, the electronic apparatus of the present invention is not limited to a portable computer. It is also possible to apply the technical idea of the present invention to other digital apparatuses such as a portable telephone and PDA (Personal Digital Assistants).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus, comprising:
   a casing having a substrate mounting section arranged therein;
   a wiring substrate mounted to the substrate mounting section of said casing;
   a guide section formed in said substrate mounting section and determining the installing position of the wiring substrate relative to said substrate mounting section; and
   a flexible insulator holding the wiring substrate such that the wiring substrate is located between said insulator and the substrate mounting section, said insulator having a fixed end fixed to the casing and a free end detachably engaged with the substrate mounting section.

2. The electronic apparatus according to claim 1, wherein the fixed end and the free end of said insulator are positioned apart from each other with said wiring substrate interposed therebetween.

3. The electronic apparatus according to claim 1, wherein said insulator is formed of a rigid synthetic resin film.

4. The electronic apparatus according to claim 1, wherein said guide section includes a plurality of convex portions in contact with the outer peripheral edge portion of said wiring substrate, said convex portions protrude from said substrate mounting section in the thickness direction of said casing.

5. The electronic apparatus according to claim 4, wherein the fixed end of said insulator is fixed to said casing with a spacer interposed therebetween, and said spacer permits said insulator to be positioned flush with said wiring substrate.

6. The electronic apparatus according to claim 1, wherein said guide portion includes a concave portion in which said wiring substrate can be detachably mounted.

7. The electronic apparatus according to claim 1, wherein said guide section includes a wall surrounding the outer peripheral edge portion of said wiring substrate.

8. The electronic apparatus according to claim 1, wherein said casing includes an engaging section in the periphery of said substrate mounting section, the free end of said insulator being detachably engaged with said engaging section.

9. The electronic apparatus according to claim 1, wherein said insulator includes a slit positioned between the fixed end and the free end.

10. The electronic apparatus according to claim 1, further comprising a cable electrically connected to said wiring substrate and extending within said casing.

11. The electronic apparatus according to claim 10, wherein said insulator includes a holding section for detachably holding said cable, and said holding section includes through holes for passing said cable and a slit bridging said through holes.

12. The electronic apparatus according to claim 11, wherein the holding section of the insulator is located close to a connection portion between the cable and the wiring substrate.

13. The electronic apparatus according to claim 1, further comprising a functional part housed inside said casing, said functional part overlapping with said wiring substrate in the thickness direction of said casing.

14. The electronic apparatus according to claim 1, wherein the free end of me insulator is engaged with the casing, whereby the wiring substrate is held between the insulator and the substrate mounting section and is also covered by the insulator.

15. An electronic apparatus, comprising:
    a casing having a substrate mounting section arranged therein;
    an antenna substrate for a wireless communication, which is mounted to the substrate mounting section arranged within the casing;
    a cable connected to said antenna substrate and extending within said casing;
    a guide section formed in said substrate mounting section and serving to determine the installing position of the antenna substrate relative to said substrate mounting section; and
    a flexible insulator holding said antenna substrate such that said antenna substrate is located between said insulator and the substrate mounting section, said insulator including a fixed end fixed to said casing, a free end detachably engaged with said casing, and a holding section detachably holding said cable.

16. An electronic apparatus, comprising:
    a first casing;
    a second casing rotatably supported by said first casing and having a substrate mounting section arranged therein:
        a wiring substrate mounted to said substrate mounting section of said second casing;
        a guide section formed in said substrate mounting section and serving to determine the installing position of the wiring substrate relative to said substrate mounting section; and
        a flexible insulator holding said wiring substrate such that the wiring substrate is located between said insulator and the substrate mounting section, said insulator including a fixed end fixed to said second casing, and a free end detachably engaged with said second casing.

17. The electronic apparatus according to claim 16, wherein said wiring substrate is an antenna substrate for a wireless communication, said antenna substrate being positioned in an upper end portion of said second casing remotest from said first casing when said second casing is swung to said opening position.

18. An electronic apparatus comprising:
    a casing having a substrate mounting section arranged therein;
    a wiring substrate mounted to the substrate mounting section of said casing;
    a guide section formed in said substrate mounting section and determining the installing position of the wiring substrate relative to said substrate mounting section, and
    a flexible insulator holding the wiring substrate such that the wiring substrate is located between the insulator and the substrate mounting section, the insulator having a fixed end fixed to the casing, with a spacer interposed therebetween, and a free end detachably engaged with the substrate mounting section.

19. The electronic apparatus according to claim 18, wherein the spacer is located parallel with an outer peripheral edge portion of the wiring substrate and is located under the outer peripheral edge portion when the casing is made upright.

20. The electronic apparatus according to claim 19, wherein the spacer keeps the insulator located in the same plane as the wiring substrate.

21. The electronic apparatus according to claim 20, wherein the spacer is formed of an elastically deformable sponge and is provided between the insulator and the casing.

* * * * *

UNITED STATES PATENT AND TRADEMARK OFFICE
CERTIFICATE OF CORRECTION

PATENT NO. : 6,456,499 B1
DATED : September 24, 2002
INVENTOR(S) : Nakajima et al.

It is certified that error appears in the above-identified patent and that said Letters Patent is hereby corrected as shown below:

Column 10,
Line 2, change "me insulator" to -- the insulator --.

Signed and Sealed this

Eighteenth Day of March, 2003

JAMES E. ROGAN
*Director of the United States Patent and Trademark Office*